United States Patent
Bergland et al.

(10) Patent No.: US 11,664,816 B2
(45) Date of Patent: May 30, 2023

(54) LOSSY COMPRESSION TECHNIQUES

(71) Applicant: Apple Inc., Cupertino, CA (US)

(72) Inventors: Tyson J. Bergland, Sunnyvale, CA (US); Karthik Ramani, San Jose, CA (US); Stephan Lachowsky, San Francisco, CA (US); Justin A. Hensley, Mountain View, CA (US); Davoud A. Jamshidi, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 417 days.

(21) Appl. No.: 16/855,540

(22) Filed: Apr. 22, 2020

(65) Prior Publication Data

US 2021/0336632 A1    Oct. 28, 2021

(51) Int. Cl.
*H03M 7/30* (2006.01)
*H04N 19/182* (2014.01)
*H04N 19/176* (2014.01)

(52) U.S. Cl.
CPC ........ *H03M 7/3059* (2013.01); *H04N 19/176* (2014.11); *H04N 19/182* (2014.11)

(58) Field of Classification Search
CPC .............. H03M 7/3059; H03M 7/3082; H04N 19/176; H04N 19/182
(Continued)

(56) References Cited

U.S. PATENT DOCUMENTS

| 6,058,217 | A | * | 5/2000 | Kondo | G06T 9/005 375/240.03 |
| 9,660,666 | B1 | | 5/2017 | Ciarlini et al. | |

(Continued)

FOREIGN PATENT DOCUMENTS

| EP | 0 424 060 A2 * | 4/1991 |
| EP | 0424060 A2 | 4/1991 |
| EP | 0840510 A1 | 5/1998 |

OTHER PUBLICATIONS

International Search Report and Written Opinion in PCT Appl. No. PCT/US2021/027623 dated Jul. 23, 2021, 12 pages.

*Primary Examiner* — Kwang B Yao
*Assistant Examiner* — Syed M Bokhari
(74) *Attorney, Agent, or Firm* — Kowert, Hood, Munyon, Rankin & Goetzel, P.C.; Michael B. Davis; Dean M. Munyon

(57) ABSTRACT

Techniques are disclosed relating to compression of pixel data using different quantization for different regions of a block of pixels being compressed. In some embodiments, compression circuitry is configured to determine, for multiple components included in pixels of the block of pixels being compressed, respective smallest and greatest component values in respective regions of the block of pixels. The compression circuitry may determine, based on the determined smallest and greatest component values, to use a first number of bits to represent delta values relative to a base value for a first component in a first region and a second, different number of bits to represent delta values relative to a base value for a second component in the first region. The compression circuitry may then quantize delta values for the first and second components of pixels in the first region of the block of pixels using the determined first and second numbers of bits. In some embodiments, the compression circuitry determines whether to provide cross-component bit sharing within a region.

20 Claims, 10 Drawing Sheets

(58) Field of Classification Search
USPC .......................................................... 382/232
See application file for complete search history.

(56) References Cited

U.S. PATENT DOCUMENTS

| | | |
|---|---|---|
| 2013/0293565 A1 | 11/2013 | Arvo |
| 2014/0104289 A1 | 4/2014 | Nakayama |
| 2014/0173674 A1* | 6/2014 | Wolman ............. H04N 21/6181 |
| | | 725/116 |
| 2017/0150148 A1* | 5/2017 | Zhang .................. H04N 19/625 |
| 2018/0089091 A1 | 3/2018 | Akenine-Moiler et al. |
| 2018/0138921 A1 | 5/2018 | Arelakis et al. |

\* cited by examiner

*Determine, at least partially in parallel for multiple different lossless compression techniques, a number of bits needed to represent a least compressible pixel, using that technique, in a set of pixels being compressed*
710

*Select one of the compression techniques based on the determined numbers of bits and header sizes needed to store compression information for the multiple compression techniques*
720

*Store information that encodes values for the set of pixels using the selected compression technique*
730

FIG. 7

LOSSY COMPRESSION TECHNIQUES

BACKGROUND

Technical Field

This disclosure relates to data compression circuitry.

Description of the Related Art

Computing devices may compress various types of data, e.g., to reduce memory footprint or bandwidth. Compression may be particularly useful for multi-media data such as pixels processed by a graphics processor. Some compression is lossy such that decompressed data may not match the image before compression. Lossless compression, on the other hand, provides the original data after decompression. Different lossless compression techniques may have different characteristics, e.g., compute resources such as area or power required for compression, compression speed, compression ratios, etc. Similarly, different lossy compression techniques may have different characteristics, including accuracy of data after decompression (some lossy techniques may cause more loss than others). The quality of a compression implementation may have substantial effects on performance, power consumption, or circuit area.

BRIEF DESCRIPTION OF THE DRAWINGS

FIG. 7 is a flow diagram illustrating an example method for lossless compression, according to some embodiments.

Figure 1A:
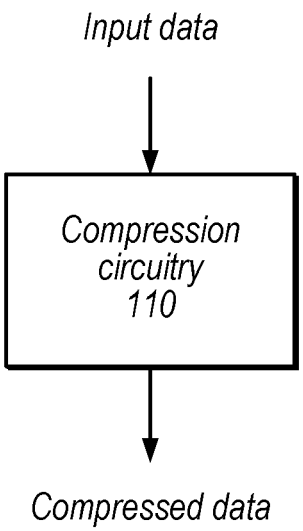
FIG. 1A is a block diagram illustrating example compression circuitry, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "compression circuit configured to compress a block of pixel data" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

Further, as used herein, the terms "first," "second," "third," etc. do not necessarily imply an ordering (e.g., temporal) between elements. For example, a referring to a "first" graphics operation and a "second" graphics operation does not imply an ordering of the graphics operation, absent additional language constraining the temporal relationship between these operations. In short, references such as "first," "second," etc. are used as labels for ease of reference in the description and the appended claims.

DETAILED DESCRIPTION

This disclosure discusses embodiments of techniques for both lossless and lossy compression. In some embodiments, a processor operates in a mode in which lossy compression is used for a given block of pixels only if it is determined that lossless compression cannot meet a target output data size. In various disclosed embodiments, compression operates on blocks of pixel data, but these examples are not intended to limit the scope of the present disclosure. Rather, the disclosed techniques may be implemented to compress various types of input data.

FIG. 1A is a block diagram illustrating example compression circuitry 110. As discussed above, the input data may include values for a block of pixels to be compressed (and each pixel may include values for multiple components or channels). The compressed data may include data representing pixels after compression, header information that indicates the type of compression used, and metadata that describes the size of the compressed block, for example.

Figure 1B:
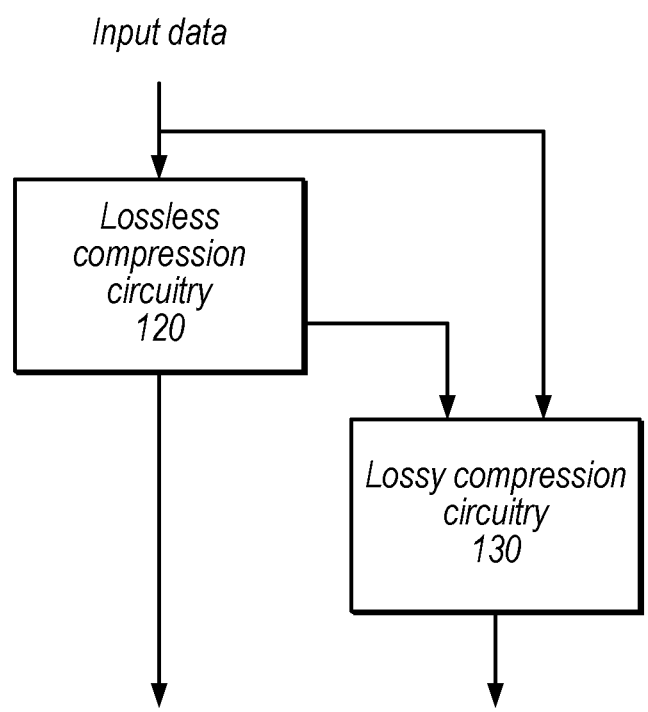
FIG. 1B is a block diagram illustrating example lossless and lossy compression circuitry, according to some embodiments.

FIG. 1B is a block diagram illustrating example lossless compression circuitry 120 and lossy compression circuitry 130, according to some embodiments. In some embodiments, lossy compression circuitry 130 is not configured to compress the input data unless lossless compression circuitry 120 determines it cannot achieve a target compressed size. In some embodiments, lossless and lossy compression may proceed at least partially in parallel. Although disclosed embodiments support both lossless and lossy compression, the disclosed techniques may also be used independently. For example, a processor may support the disclosed lossy compression techniques but not the disclosed lossless compression techniques, or vice versa. In some embodiments, however, disclosed techniques leverage the fact that the compression circuitry considers both lossless and lossy compression for a given block of pixels.

Figure 2A:
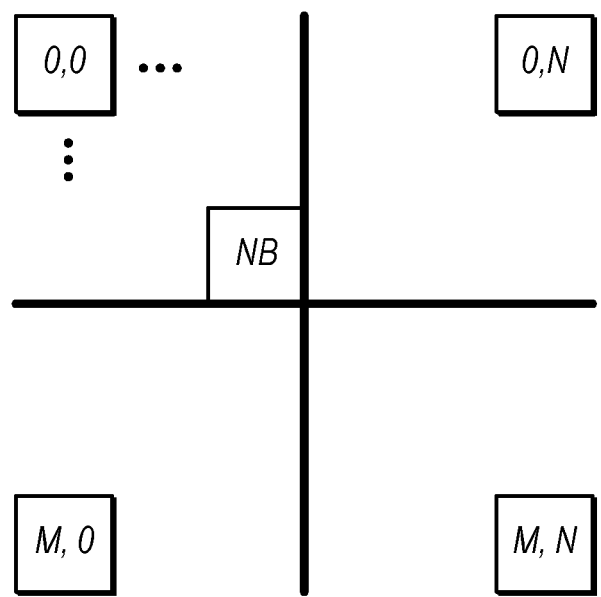
FIG. 2A is a block diagram illustrating an example block of pixels that includes four regions, according to some embodiments.

FIG. 2A is a block diagram illustrating an example block of pixels, according to some embodiments. Each pixel may have multiple corresponding data fields, e.g., components that may be used for R, G, B, A channels, or other uses. Thus, compression of the block of pixels may operate on multiple components for each valid pixel. In the illustrated embodiment, the block includes M×N pixels where M and N are integers that may be the same or different. For example, the block may be 4×4, 4×8, 8×4, 8×8, 8×16, etc. In the illustrated example, the block is divided into four regions by the heavier lines of FIG. 2A. A block may be sub-divided into various appropriate numbers of regions that each include multiple pixels, in some embodiments.

In some embodiments, the device determines different lossless compression predictors in order to select a lossless compression technique, e.g., that results in the greatest compression ratio among available techniques. Different predictors may use different base pixels, e.g., to encode pixels based on their delta values relative to the base. For example, disclosed techniques may utilize origin, gradient, and neighbor predictors. In some embodiments, the base and gradient predictors use pixel (0,0) as a base pixel while the neighbor predictor uses a different neighbor base (NB) pixel. In the illustrated example, the NB pixel is located near the center of the block. In other embodiments, one or more predictors may dynamically determine their base location for a given block of pixels, although this may increase complexity and power consumption.

In some embodiments, an origin predictor represents each pixel component as a delta value relative to the same component of a base pixel (e.g., pixel (0,0)). In some embodiments, an origin-with-decorrelation predictor may operate similarly to the origin predictor but may first subtract out values of one component (e.g., the green component) from the other corresponding components which may reduce correlation among components and may positively affect compression ratios. In some embodiments, a gradient predictor represents each pixel component as a delta value relative to the same component of a base pixel plus a gradient value. In some embodiments, a neighbor predictor represents each pixel component as a delta value relative to the same component of a neighbor pixel. A neighbor-with-decorrelation predictor may be similar to a neighbor predictor, but with one component subtracted.

Figure 2B:
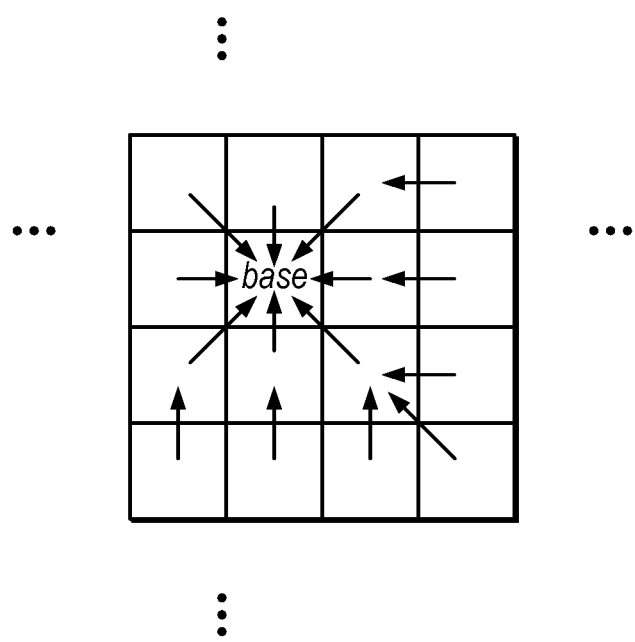
FIG. 2B is a block diagram illustrating example neighbor relationships for a block of pixels for a neighbor predictor, according to some embodiments.

FIG. 2B shows an example pattern for a neighbor predictor, according to some embodiments. In FIG. 2B, the arrow from each pixel indicates the neighbor pixel based on which its delta is computed. As shown, the pattern includes a base pixel which is not represented using a delta and which may be located at various locations in different embodiments. The illustrated pattern is included for purposes of explanation, but is not intended to limit the scope of the present disclosure; various patterns for encoding relationships between pixels may be implemented for various predictors.

Example Lossless Compression Using Multiple Predictors

In some embodiments, a computing system computes multiple lossless predictors for different compression techniques, at least partially in parallel, to determine the performance of multiple different compression techniques on an input block of pixel data. For example, consider a situation where an origin predictor has a pixel with a greatest delta from the origin value of seven while a neighbor predictor has a pixel with a greatest delta of three. In an implementation with unsigned deltas t, the origin predictor needs three bits to represent each pixel in compressed form while the neighbor predictor only needs two bits to represent each pixel in compressed form. The overall best predictor may further be influenced by additional considerations such as header size needed, whether use of a bias affects delta size, whether pixels in different regions of the block can be represented using different numbers of bits, etc., as discussed in further detail below. Thus, after computing size needed for multiple predictors in parallel, the system may select the compression technique that provides the smallest compression size (e.g., header metadata plus bits needed to represent all the pixels in the block).

Figure 3:
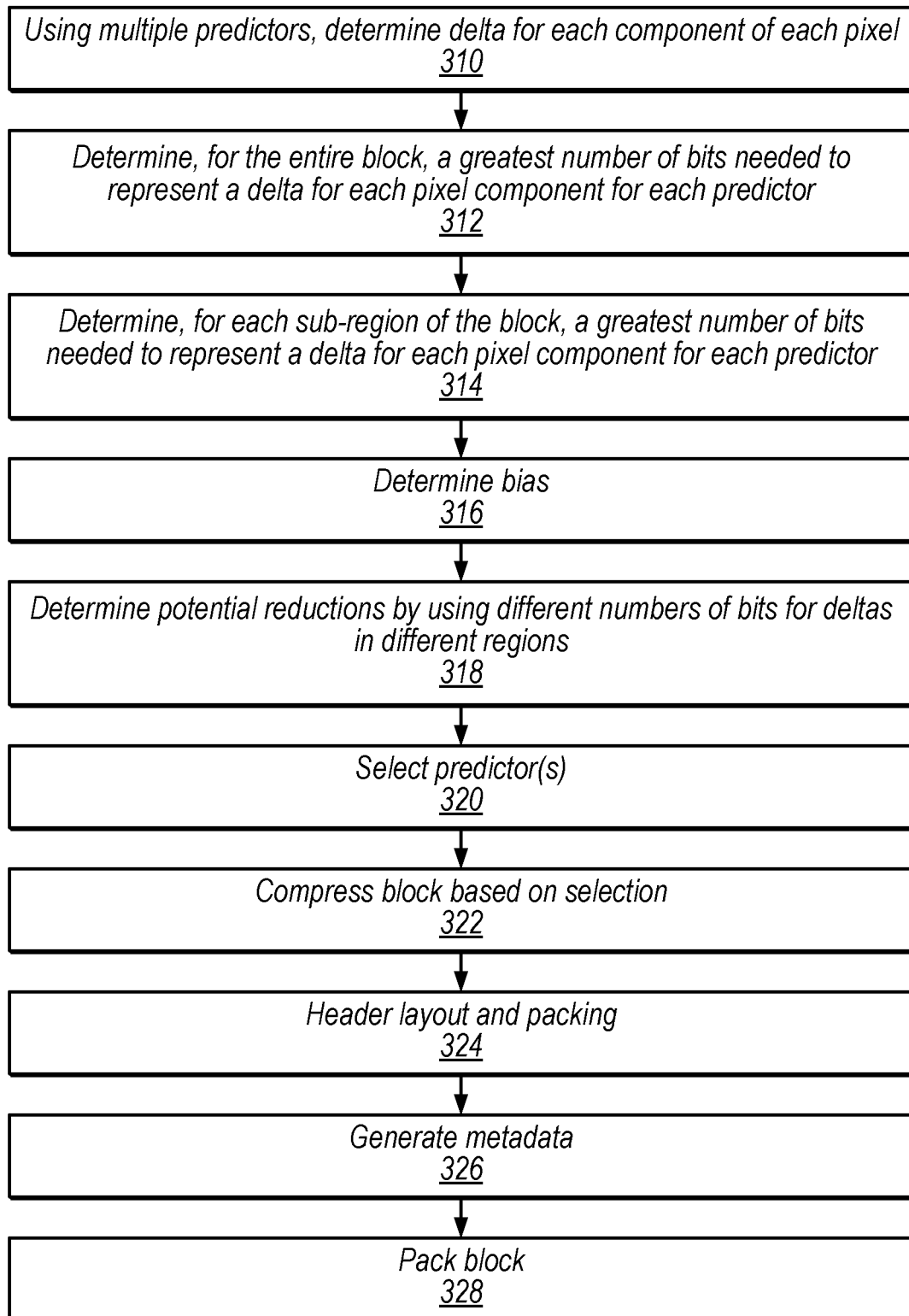
FIG. 3 is a flow diagram illustrating an example method for selecting a lossless compression technique, according to some embodiments.

FIG. 3 is a flow diagram illustrating an example technique for lossless compression of a block of pixels, according to some embodiments. The method shown in FIG. 3 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 310, in the illustrated embodiment, a computing system determines a delta for each component of each pixel, using multiple predictors. Example predictors include an origin predictor, an origin-with-decorrelation predictor, a gradient predictor, a neighbor predictor, and a neighbor-with-decorrelation predictor. For the gradient predictor, the system may first determine x and y gradients for the origin pixel (0, 0) for each component, e.g., according to the equations:

$$dcbx = \text{wrap\_to\_range}(pixel(1,0).c - pixel(0,0).c, \text{component\_width}/2)$$

$$dcdy = \text{wrap\_to\_range}(pixel(0,1).c - pixel(0,0).c, \text{component\_width}/2)$$

wherein the component_width indicates to the number of bits used to represent a component and the ".c" notation refers to the current component.

The following pseudocode represents example techniques to determine a delta for each predictor for a given pixel at the x, y position in the block:

```
delta_origin = pixel(x, y).c – pixel(0, 0).c
where pixel (0,0) is the base pixel for the origin predictor.
    delta_origin_decorrelate = wrap_to_range(pixel(x, y).c –
        pixel(x, y).green) –
            wrap_to_range(pixel(0, 0).c – pixel(0, 0).green)
where decorrelation is performed by subtracting the green component.
    delta_gradient = pixel(x, y).c – ( pixel(0, 0).c + dcdx*x + dcdy*y )
where pixel (0,0) is the base pixel for the gradient predictor.
    delta_neighbor = pixel(x, y).c – pixel(nx, ny).c
where pixel (nx,ny) is the neighbor pixel for pixel (x,y) according to a
neighbor pattern.
    delta_neighbor_decorrelate = wrap_to_range(pixel(x, y).c –
        pixel(x, y).green) –
            wrap_to_range(pixel(nx, ny).c – pixel(nx, ny).green)
```

At 312, in the illustrated embodiment, the system determines, for the entire block, the greatest number of bits needed to represent a delta for each pixel component for each predictor. The system may encode deltas as signed values with a bit width equal to the component width. The following represents an example technique to determine the number of bits needed for deltas of a given signed component:

$$bits\_c = \max(signed\_num\_bits(max\_delta\_c), signed\_num\_bits(min\_delta\_c))$$

where signed_num_bits is a function that determines the number of bits needed to contain a 2's compliment encoding of the input, max_delta_c is the greatest delta value for the component and min_delta_c is the smallest delta value for the component. In some embodiments, the system is configured to determine the number of bits needed to pack all the deltas in the block for each component.

At 314, in the illustrated embodiment, the system also determines, for each sub-region of the block (e.g., each of the four regions shown in FIG. 2A), a greatest number of bits needed to represent a delta for each pixel component for each predictor. In some embodiments, the system is configured to determine the number of bits needed to pack all the deltas in the each sub-region of the block for each component. In some embodiments, this may allow different regions to use different numbers of bits for deltas, when it will improve the overall compression ratio.

At 316, in the illustrated embodiment, the system determines if a bias will reduce bits_c (e.g., by one) for the block. In some embodiments, this determination is performed for each component and each predictor but is not performed separately for each region. The following pseudo-code represents an example technique to determine whether a bias should be used and the bias value:

```
biased_bits_c = num_bits(max_delta_c – min_delta_c)
if (bits_c > biased_bits_c)
    delta_bits_c = biased_bits_c;
    bias_c = (–1 << (delta_bits_c – 1)) – min_delta_c
else
    delta_bits_c = bits_c
    bias_c = 0
```

At 318, in the illustrated embodiment, the system determines potential reductions in bit widths to represent deltas if using different numbers of bits for deltas in different regions. For example, the following pseudocode represents a technique for determining region_bits_c, which represents the number of bits needed to represent a delta for a component for a particular region, where N represents the number of regions:

```
for region (0 .. N–1)
    region_bits_c = max( signed_num_bits(region_max_delta_c),
        signed_num_bits(region_min_delta_c))
    reduction_c[region] = delta_bits_c – region_bits_c
```

Note that, in some embodiments, there is a maximum reduction for a region relative to the delta_bits_c value. In some embodiments, the reduction_c[ ] for each region is encoded in the header for compressed data, if any region has a non-zero reduction.

At 320, in the illustrated embodiment, the system selects one or more predictors for use in compressing the block of pixels. In some embodiments, the system determines which predictor gives the best compression by calculating the variable size in bits. The following pseudocode represents a technique for determining the number of bits needed for deltas for a given predictor:

```
for region (0 .. N–1)
    size_predictor_c += region_bits_c_predictor[region] *
        num_pixels_region[region]
``` where num_pixels_region may vary for different regions, e.g., because the region with the origin pixel may not need a delta for that pixel.

The system may then, for each predictor, determine the cost of the header, which may vary based on whether the predictor uses regions or bias. Further, some types of predictors such as gradients may incur additional header overhead to represent the gradient.

```
size_predictor_c+=predictor_c.region_non-
    zero( )?NUM_REGIONS* region_code_
    size_bits_c:0 size_predictor_c+=predictor_c.biasV=0?delta_bits_c size_gradient_c+=component_width[c]
```

Where region_code_size_bits represents the number of bits needed to specify the size of deltas for a region, region_nonzero is defined as true if any region reduction code (reduction_c[0 . . . N–1] above) is non-zero, and predictor_c.bias indicates whether a predictor used bias.

In some embodiments, the system selects the predictor with the smaller size for each component. Thus, compressing the block of pixels may use different compression techniques for different components. In some embodiments, there is a pre-defined ordering of predictor selection if predictors have the same output size. In some embodiments of lossless compression, the disclosed computations may be performed separately for different components. In contrast, as discussed below, lossy compression may share bits between components in certain situations.

At 322, in the illustrated embodiment, the system compresses the block based on the selection. This may include storing delta values for each component of each pixel using the determined parameters.

At 324, in the illustrated embodiment, the system generates a layout for a header for the block and packs the header. The header may indicate the selected predictor, the number of bits per delta, region information, bias information, etc. Detailed example embodiments of a header are discussed below with reference to FIG. 4.

At 326, in the illustrated embodiment, the system generates metadata for the block. In some embodiments, the metadata indicates the size of the compressed block. The metadata may be the same size for both lossy and lossless formats, e.g., one byte. The metadata may indicate whether the block is uncompressed or compressed. For compressed blocks, the metadata may indicate whether the block is lossy or lossless. For a lossless block, if the predictor for each component for the block is the same and no components have bias or de-correlation enabled, the block may be described as constant. The metadata may be set according to a table lookup in this scenario for different compression container formats. If the block is not constant, then the block may be padded and the metadata may describe the block size. In some embodiments, when all bits of the metadata are not needed to describe the block size, the metadata may include a portion of the mode bits for a component (e.g., component 0) from the header (which may further reduce the size of the compressed block). In some embodiments, a value of 4'b111 for metadata[7:4] indicates lossy compression. In some embodiments, this value will never occur in the metadata when the size of a lossless compressed block is less than or equal to a target size. This fact may be used by a lossy compression technique, in some embodiments, to avoid explicitly encoding the size of the compressed block in the metadata. Rather, if the metadata indicates lossy compression, this implies that the compressed block has a target block size for the lossy compression.

Figure 4:
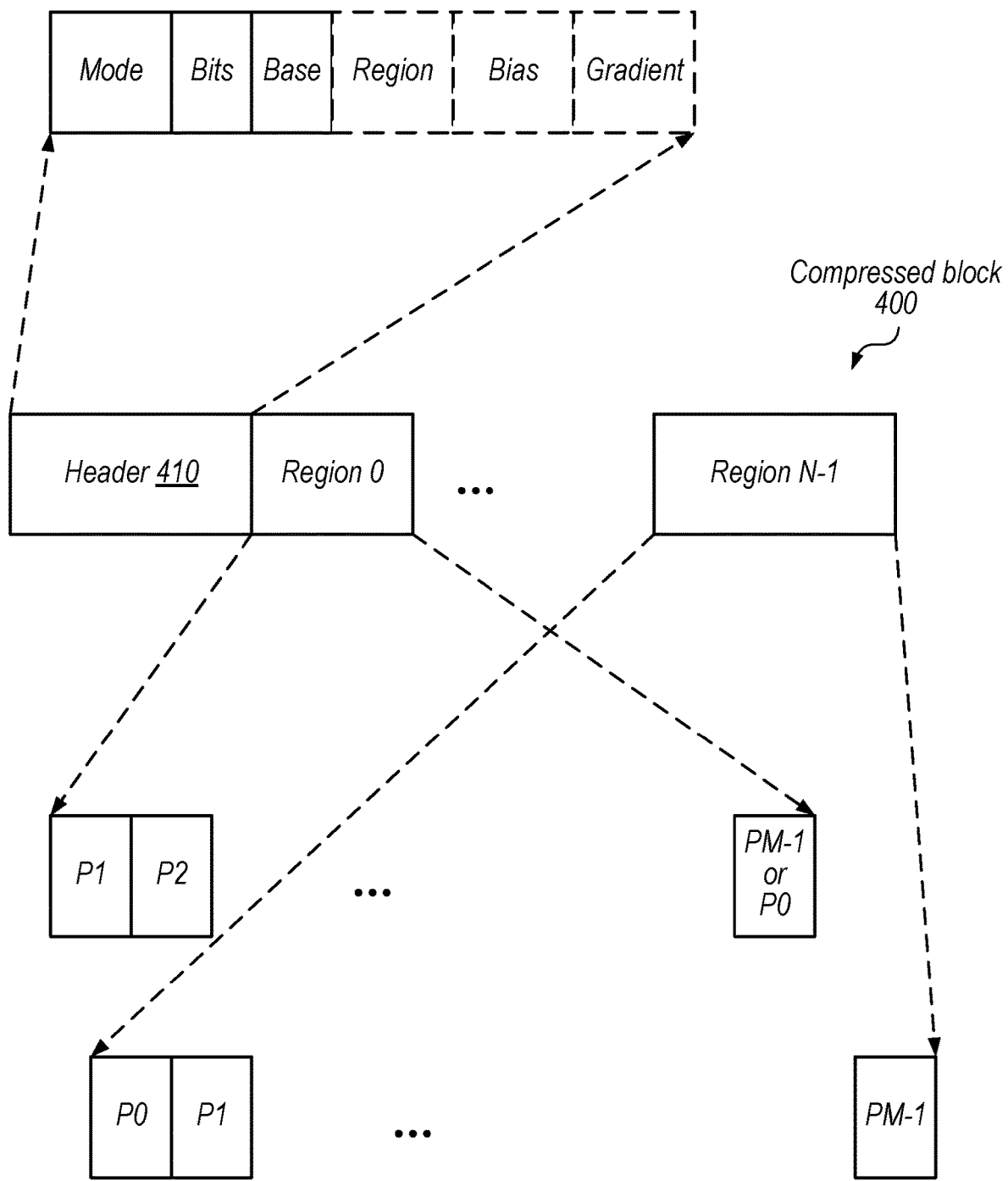
FIG. 4 is a block diagram illustrating example formatting of a lossless compressed block of pixels, according to some embodiments.

At 328, in the illustrated embodiment, the system packs the block. This may include aligning the header and region information as shown in FIG. 4 below. The deltas for each region may be packed in twiddle order. If part of the header is included in the metadata for the block, the system removes that information from the header and the size of the header is reduced. For uncompressed blocks, the system may arrange the pixels in a pre-determined order without a header. In some embodiments, multiple compressed blocks may be packed together into a macro-block for a write to memory, for example.

In various embodiments, the disclosed techniques may advantageously provide improved lossless compression ratios and improved compression speed, relative to traditional techniques. In particular, enabling different deltas widths for different regions may provide good compression in regions where one region has a very large maximum delta with a reasonable amount of header information to encode the reductions for the different regions.

FIG. 4 is a diagram illustrating an example compressed block of pixels with a header, according to some embodiments. In the illustrated embodiment, the compressed block includes header 410 and region fields that specify pixel data for N regions.

Header 410, in the illustrated embodiment, includes a mode field, a bits, field, and a base field. Header 410 may also optionally include a region field, a bias field, or a gradient field (shown using dashed lines) depending on the compression parameters used to compress the block. In some embodiments, the system generates a separate header for each component for the block of pixels. In other embodiments, a single header is used for the block and the header includes separate instances of fields for different components.

The mode field, in some embodiments, describes how the component is compressed. In some embodiments, this field indicates the selected predictor (e.g., neighbor, gradient, or origin), whether different numbers of bits per delta in different regions is enabled, whether bias is enabled, and whether decorrelation is used. For some formats that do not support decorrelation, the system may omit a decorrelation bit to reduce the size of the mode field.

The bits field, in some embodiments, indicates the delta bit width for the block. For example, the system may encode the bits field as delta_bits_c−1 for each component. The size of the bits field may be $\log_2$(component_width). In some embodiments, a delta bit width of 1 represents values from −1 to 0, a width of 2 represents values from −2 to 1, a width of 3 represents values from −4 to 3, and so on. Note that the bit widths for one or more regions may be reduced from the bit width indicated by the bits field, as discussed below.

The base field, in some embodiments, indicates the base value used for the selected predictor. The size of the base field may correspond to the component width. If decorrelation is enabled, this field indicates the decorrelated base value.

The region field, in some embodiments, describes the reduction for each region in the block. Note that this field may be included only if the mode field indicates that regions are enabled, in some embodiments. In some embodiments, this field includes a sub-field for each region that indicates that field's reduction relative to the bit width for the block. For example, if the bit width is eight and region R3's reduction is three, then the bit width for deltas in region R3 is five.

The bias field, in some embodiments, indicates the bias value to be subtracted from deltas during compression. Note that this field may be included only if the mode field indicates that bias is enabled, in some embodiments. In some embodiments, the size of this field is delta_bits_c.

The gradient field, in some embodiments, indicates the gradients dcdx and dcdy. The size of this field may be the component_width & ~1. Note that this field may be included only if the mode field indicates that the gradient predictor was selected, in some embodiments.

As shown, each region includes deltas for the pixels in that region. During decompression, the device may locate the start of each region based on header 410. In the illustrated example, region 0 includes the base pixel, (either pixel 0 or pixel M−1 in the illustrated embodiment), where M is the number of pixels per region. In the illustrated embodiment, the potential base pixel that is not actually used as the base is always located at the last location in the region, which may simplify decoding. Thus, in various embodiments, the region that includes the base pixel may include one less delta than the other regions. In the illustrated example, the pixels in the other regions (e.g., region N−1) are stored in order from pixel P0 to pixel M−1.

In some embodiments, decompression circuitry is configured to decompress a compressed block of pixels by un-doing various compression actions. For example, decompression circuitry may first determine the location of a block of pixels, e.g., based on the metadata for blocks in a larger data set that includes multiple compressed blocks. The decompression circuitry then decodes metadata for the block. If the metadata indicates a constant block, the device may copy constant data to each pixel if the sub-block includes a constant color. If the metadata indicates an uncompressed blocks, the decompression circuitry may simply unpack pixel data into an expected format.

The decompression circuitry, in some embodiments, then unpacks the header to determine the size of the variable fields and the start of the packed deltas. The device then unpacks the deltas using the bit widths specified by the header. For origin and gradient modes, they system decompresses each component directly using the header by adding the deltas to the base value. For neighbor mode, the device may initially decode interior components, followed by neighboring components. The system reverses decorrelation, if applied during compression. In some embodiments, this decompression procedure provides the original pixel data without loss.

Example Lossy Compression Techniques

In some embodiments, the computing system falls back to a lossy compression technique after a lossless technique such as the technique of FIG. 3 is determined not to meet a target compressed block size. The target block size may be programmable or may vary based on processing mode. Further, in some embodiments, the computing system may perform lossy compression without first determining the output size for lossless compression.

In some embodiments, the disclosed lossy technique separately considers different regions of a block of pixels being compressed. Further, the system may determine whether to share bits across components after selecting an initial quantization, adjust bit widths used for bases and deltas, and handle certain error conditions or fallback modes.

Figure 5:
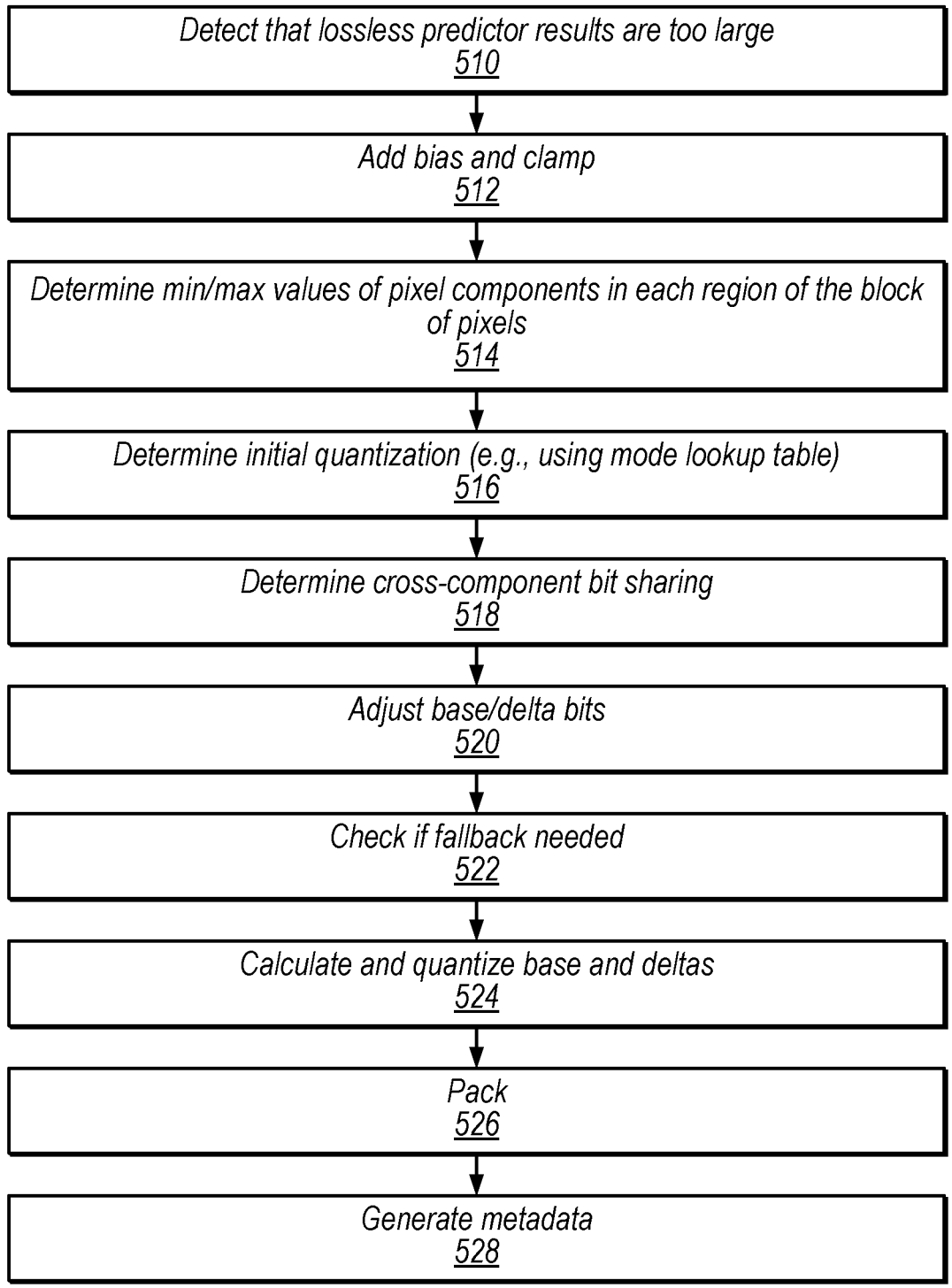
FIG. 5 is a flow diagram illustrating an example method for lossy compression, according to some embodiments.

FIG. 5 is a flow diagram illustrating an example technique for lossy compression of a block of pixels, according to some embodiments. The method shown in FIG. 5 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 510, in the illustrated embodiment, the computing system determines that lossless predictor results are too large. For example, none of the lossless predictors used in the technique of FIG. 3 may compress a block of pixels to a threshold data size. Note that in other embodiments, lossy compression may be performed without performing lossless predictors first. In some embodiments, checking whether a lossless compressor can be used before falling back to lossy compression may improve overall compression ratios.

At 512, in the illustrated embodiment, the system adds bias and clamps pixel component values. For example, the following system may determine whether the component is represented in a signed format (e.g., signed integer or signed normalized) or another format (e.g., float or unsigned). If signed, for each component and each region, the system applies bias by flipping the sign bit. The result is then clamped, if appropriate, to a minimum value for preservation.

At 514, in the illustrated embodiment, the system determines minimum and maximum values for each pixel component in each region of the block of pixels being compressed. This is one technique for determining the least compressible pixel(s) in each region. In some embodiments, the minimum value is used as the base and the maximum value is used to determine the range of the component. The outputs of this processing may be the min_value for each component for each region, the min_position (position of the pixel with the min value) for each component for each region, and the max_value for each component for each region.

At 516, in the illustrated embodiment, the system determines a lossy quantization mode. For a given component width, a number of modes may be available. The modes may be predetermined and encoded, e.g., in a lookup table. Each mode may have potentially different values for various attributes such as: range, base bits, delta bits, level, free level, and whether the base is protected. The base bits and delta bits may indicate the number of bits used to encode the base and deltas, respectively. Bases may be quantized more in higher modes while deltas may be quantized more with lower modes. The level may indicate how heavily a mode will be quantized (or not). The system may also use the level to determine whether to apply cross-component bit sharing. The level may be signed, and lower level values may indicate greater quantization, overall. The free level may indicate the number of levels that can be given to another component without subtracting from the current component's base or delta bits. A protected base indicates that the component's base bits cannot be decremented when giving levels to another component.

As one example, the following table includes mode information for two modes of a 16-bit component width, according to some embodiments (although note that various encodings may be implemented). In this example, the other modes not shown (e.g., modes 1 through 14) may have various ranges, base bits, delta bits, levels, free levels, and protected values, e.g., in the ranges between the values for mode 0 and mode 15:

| Mode | Range | Base bits | Delta bits | Level | Free level | Protected? |
|------|-------|-----------|------------|-------|------------|------------|
| 0    | 2     | 16        | 1          | 5     | 4          | 1          |
| 15   | 65536 | 8         | 7          | -6    | 0          | 0          |

In some embodiments, to determine the lossy quantization mode, the system first determines, for each region, the number of bits needed to pack all deltas by finding the maximum deltas for each component and determining the number of unsigned bits needed to represent the deltas. This value may then be used to generate a quantization mode for each component based on these ranges. Said another way, each mode may be associated with a range and the mode may be selected such that the difference between the max_value and min_value for a component in a region falls within that range. Once the mode is selected, compression circuitry may determine whether to perform cross-component bit sharing based on the mode.

In some embodiments, the system further determines whether expanding the delta range (reducing delta quantization) by quantizing the base value will reduce quantization loss. For example, the system may apply a mask to determine a new base value after quantization and determine whether this value meets a transition threshold. Therefore, the system may determine, in some situations, to further quantize the base min_value to provide additional bits for use for delta quantization. This may be implemented by increasing the quantization mode by one, for example. At this point, the system has selected a quantization mode for each component in each region, in some embodiments.

At 518, in the illustrated embodiment, the system determines whether to use cross-component bit sharing. Speaking generally, some components may need fewer base/delta bits (e.g., for constant values or small delta ranges) and can give up some of their bits for other components to reduce quantization errors for the other components.

In some embodiments, this includes, for each region, sorting each component's quantization modes e.g., from smallest to largest. For an example four-component format, for example, the system may sort the modes such that m0 corresponds to the component with the smallest mode, m3 to the component with the greatest mode, and m1 and m2 to the two other components in an example four-component format.

The system may then determine the differences between each component's modes and use the differences to determine which components gain or lose quantization levels. The following code shows one non-limiting example of such a computation, but various techniques are contemplated:

```
d3_1 = mode[m3] - mode[m1]
d3_2 = mode[m3] - mode[m2]
d2_0 = mode[m2] - mode[m0]
d3_0 = mode[m3] - mode[m0]
d2_1 = mode[m2] - mode[m1]
if (d3_1 <= 1 && mode[m0] <= 1)
    end_level[m0] = 0
    end_level[m1] += (start_level[m0] + 0)/3
    end_level[m2] += (start_level/m0] + 1)/3
    end_level[m3] += (start_level[m0] + 2)/3
else if (d3_2 <= 1 && mode[m0] <= 1)
    end_level[m0] = 0
    end_level[m1] = start_level[m1] > 0 ? 0 : start_level[m1]
    end_level[m2] += (start_level[m0] + (start_level[m1] -
end_level[m1]) + 0)/2
    end_level[m3] += (start_level[m0] + (start_level[m1] -
end_level[m1]) + 1)/2
//...
else
    if (d3_0 > 0 && start_level[m0] > 0)
        end_level[m0] = 0
        end_level[m3] += start_level[m0]
    if (d2_1 > 0 && start_level[m1] > 0)
        end_level[m1] = 0
        end_level[m2] += start_level[m1]
```

Note this code example is for four-channel bit sharing, but similar techniques may be used with different numbers of channels, e.g., in two-channel modes. At this point, the system has distributed quantization levels across each component and start_level and end_level indicate how each component will be quantized. Note that although the discussion above regarding modes and sharing bits based on modes is included for purposes of explanation, the present disclosure is not limited to these specific techniques. Rather, disclosed systems may implement various techniques to determine whether to share bits among components within a given region.

At 520, in the illustrated embodiment, the system adjusts the base and delta bits. In some embodiments, this uses the quantization levels determined in element 518. For example, the following pseudocode may implement this functionality.

```
base_bits[num_components] = {0}
dquad_delta_bits[num_components] = {0}
for c in (0..num_components)
    // Initialize the base and delta bit widths
    base_bits[c] = dq_consts_table[fmt][mode[c]].base_bits
    dquad_delta_bits[c] = dq_consts_table[fmt][mode[c]].delta_bits
    // Apply cross-component bit sharing results to base and delta bit
    widths
    change = end_level[c] - start_level[c]
    if (change < 0 && -change >
dq_consts_table[fmt][mode[c]].free_level)
    {
        dquad_delta_bits[c]--
        if(!dq_consts_table[fmt][mode[c]].protected_base) {
            base_bits[c]--
        }
    } else if (change > 0) {
        dquad_delta_bits[c] += change
        base_bits[c] += change
    }
    // Clamp the base and delta bit widths to the component width.
    // Clamp delta bits to 0 if mode indicates component is constant
    base_bits[c] = min(base_bits[c], comp_width[c])
    dquad_delta_bits[c] = min(dquad_delta_bits[c],
        ((dq_consts_table[fmt][mode[c]].delta_bits != 0) ?
        comp_width[c] : 0))
```

At this point, the system has generated final base bits and delta bits for each component, in some embodiments.

At 522, in the illustrated embodiment, the system checks if pixel-quantization fallback is needed. In certain situations, it may be preferred to quantize input pixel data within a region directly rather than quantizing the base and deltas. One example situation is when the level of quantization used for deltas creates quantization errors that exceed direct quantization of the input pixel data. Another such situation is when the input data is represented in a floating point format and a component had at least one value that matched a special encoding (e.g., negative zero, plus or minus infinity, or canonical not a number (NaN) wherein the exponent is all 1's and the mantissa's most-significant bit is set. In some embodiments, the system is configured to fallback to direct quantization of pixel values for a region if either of these scenarios is detected for that region. If fallback occurs, the system may skip to element 526 for that region.

At 524, in the illustrated embodiment, the system calculates and quantizes bases and deltas according to the selected parameters. The system may determine the delta for pixel components in a region by subtracting their value from the base value for that region. Thus, for each N-pixel region, N−1 delta values may be generated for each component, because the base pixel has an implied delta value of zero. In some embodiments, the system then quantizes the delta values using the determined numbers of bits for each region. The quantization may include adjustment to preserve the max component value and to reduce bias (e.g., bias due to midpoint reconstruction during decompression).

Figure 6:
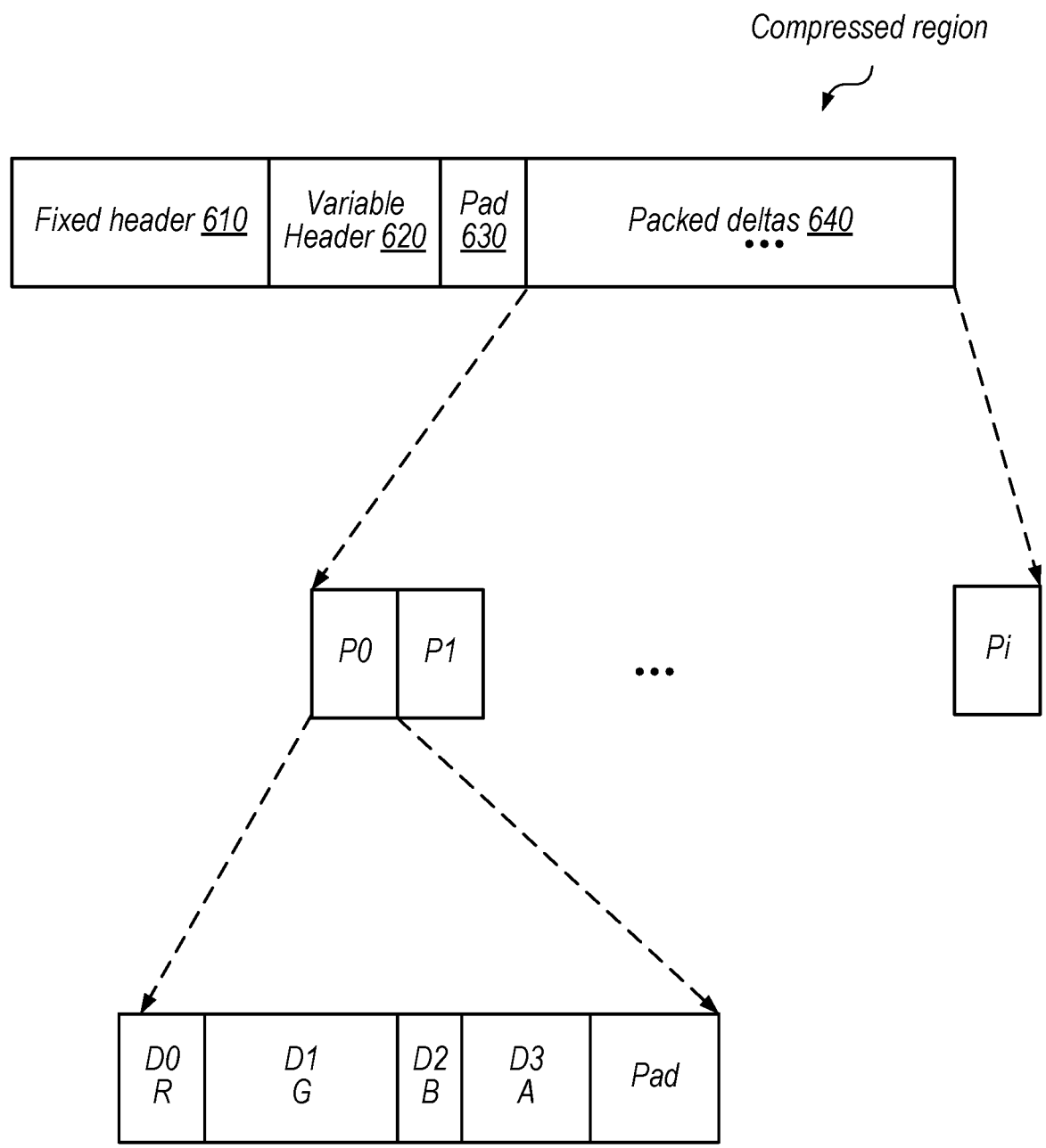
FIG. 6 is a block diagram illustrating example formatting of a region of a lossy compressed block of pixels, according to some embodiments.

At 526, in the illustrated embodiment, the system packs the compressed pixel information. The packing may be performed differently depending on whether pixel-quantization fallback mode was used. FIG. 6, discussed in further detail below, provides example packing formats.

At 528, in the illustrated embodiment, the system creates metadata for the compressed data. In some embodiments, the metadata is the same size for all formats, e.g., one byte. In some embodiments, sub-blocks with no valid data have a metadata value of zero. In some embodiments, setting metadata[7:4] to 4'b1111 indicates a lossy mode, which may imply that the size of the compressed block corresponds to a lossy target size (which may avoid explicitly encoding the size of the compressed block in the metadata). In some embodiments, the remaining bits each indicate whether quantization fallback was used for a particular region (in example four-region embodiments). In some embodiments, a number of compressed blocks are then packed together, along with their metadata, e.g., for a combined write to memory.

FIG. 6 is a block diagram illustrating an example format for a region of a block of compressed pixels, according to some embodiments. In the illustrated embodiment, the format includes a fixed header 610, variable header 620, padding bits 630, and packed deltas 640.

In the fixed header 610 and variable header 620, in the some embodiments, the system interleaves data for the different components (e.g., RGBA). The data, in some embodiments, must fit within $\frac{1}{4}^{th}$ of the lossy target size. In some embodiments, padding 630 is added such that the header is aligned to the start of the data for the region and the last delta is aligned with the end of the data for the region. Fixed header 610, in some embodiments, encodes the mode while the variable header 620 encodes the base value position, and quantized base value, for each component.

In some embodiments, packed deltas 640 include a delta for each pixel in the region for each component, except for the base. For example, in the illustrated embodiment packed deltas include data for pixels P0 through Pi where there are i+2 pixels in the region. In the illustrated four-component embodiment, each pixel field includes four deltas (one for each component) and may include padding if needed. Note that greater or smaller number of deltas may be included for embodiments with different number of components per pixel. When fallback mode is used for a region, in some embodiments, all components are quantized equally and there is no header encoding.

Decompression circuitry, in some embodiments, is configured to perform the following procedure for lossy decompression. First, the device may determine the location of a compressed block, e.g., based on metadata values of previous blocks. Second, the decompression circuitry may decode the metadata for the block. If the metadata indicates a constant block, the decompression circuitry may copy the color to each pixel. If the metadata indicates a lossless block that fits within the target size, lossless decompression circuitry decodes the block, as described above with reference to lossless techniques. If the metadata indicates a lossy block that required quantization, lossy decompression circuitry decodes the block.

The decompression circuitry, for each region in the packed block, determines the region encoding. If fallback encoding was used, it unpacks the region and performs midpoint reconstruction to de-quantize each pixel. Decompression of this region may be finished, at this point. If fallback encoding was not used, the decompression circuitry unpacks and decodes based on the extracted mode. In some embodiments, this includes determining base and delta bit widths based on the mode and adjusting according to cross-component bit sharing (the decompression circuitry may perform the same calculation as the compression circuitry to determine cross-component bit sharing based on modes for each component). The decompression circuitry may then determine unpack the base and base position and unpack quantized deltas. The decompression circuitry may then de-quantize the deltas and reconstruct pixel values. For lossy compression, the output pixel component values may not match the input pixel component values due to quantization.

Disclosed techniques may advantageously provide good compression ratios, low power consumption, and improved accuracy for lossy compression, relative to traditional techniques.

Example Methods

FIG. 7 is a flow diagram illustrating an example method for lossless compression, according to some embodiments. The method shown in FIG. 7 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 710, in the illustrated embodiment, compression circuitry determines, at least partially in parallel for multiple different lossless compression techniques, a number of bits needed to represent a least compressible pixel, using that technique, in a set of pixels being compressed. A "least compressible pixel" in a set of pixels refers to a pixel that requires the greatest amount of data to represent in a given compression technique. For example, for a set of four pixels and an origin predictor, consider a situation where the pixels have respective deltas of one, two, four, and thirty-one. The pixel with the delta of thirty-one is the least compressible pixel because it requires the most bits to represent its delta for an origin compression technique. Note that multiple pixels may be "least compressible pixels" in a set, e.g., if multiple pixels require the same greatest number of bits. In some embodiments, the elements of FIG. 7 are performed separately for different components of the pixels in the set of pixels.

In some embodiments, the compression circuitry determines, for multiple regions of pixels in the set of pixels for ones of the compression techniques, a region number of bits needed to represent a least compressible pixel, using that technique. In some embodiments, header information for one or more of the techniques includes fields indicating differences between respective region numbers of bits and the number of bits. This may provide better compression ratios, e.g., in scenarios where one region has a particularly difficult pixel but other regions do not.

In some embodiments, the compression techniques include an origin technique that determines deltas between values for pixels in the set of pixels and a value of an origin pixel in the set of pixels, a neighbor technique that determines deltas between values for adjacent pixels in the set of pixels, and a gradient technique that determines deltas between values for pixels in the set of pixels and a value of an origin pixel in the set of pixels added to a gradient value that is based on one or more pixels adjacent to the origin pixel. In some embodiments, the pixel data includes multiple components per pixel and the compression techniques include one or more decorrelation techniques that subtract values from one component (e.g., a green component) from one or more other components. One of more of the compression techniques may have fixed base pixel locations, which may be different for different techniques.

At 720, in the illustrated embodiment, the compression circuitry selects one of the compression techniques based on the determined numbers of bits for and header sizes needed to store compression information for the multiple compression techniques. In some embodiments, selection of the compression technique may be further based on determined region numbers of bits.

At 730, in the illustrated embodiment, the compression circuitry stores information that encodes values for the set of pixels using the selected compression technique. For example, the compression circuitry may store a delta for each component for each pixel according to the selected technique and generate header information indicating the selected technique and the size of the deltas.

In some embodiments, the compression circuitry generates metadata that indicates the size of the compressed set of pixels. In some embodiments, the metadata has a fixed size and the compression circuitry, in response to determining that all bits of the metadata are not needed to represent the size of the compressed set of pixels, includes one or more bits of header information in the metadata. This may further reduce the overall size of the compressed block of pixels.

Figure 8:
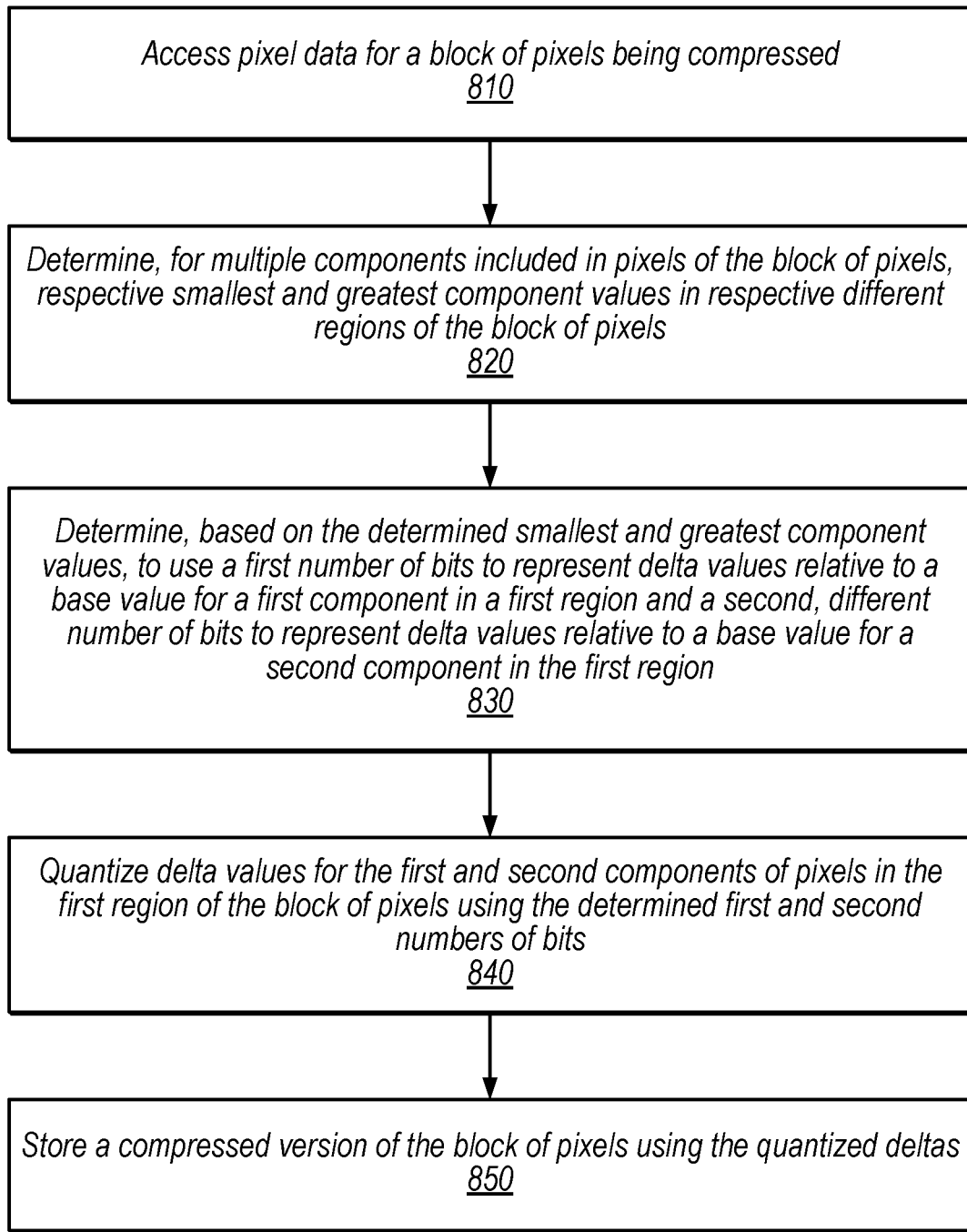
FIG. 8 is a flow diagram illustrating an example method for lossy compression, according to some embodiments.

FIG. 8 is a flow diagram illustrating an example method for lossy compression, according to some embodiments. The method shown in FIG. 7 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 810, in the illustrated embodiment, compression circuitry accesses pixel data for a block of pixels being compressed. The pixel data may include values for multiple components for each pixel. The component values may have different widths for different blocks of pixels and the widths may be programmable. In some embodiments, the compression circuitry determines whether to apply bias to one or more component values represented in a signed format.

At 820, in the illustrated embodiment, the compression circuitry determines, for multiple components included in pixels of the block of pixels, respective smallest and greatest component values in respective different regions of the block of pixels.

At 830, in the illustrated embodiment, the compression circuitry determines, based on the determined smallest and greatest component values, to use a first number of bits to represent delta values relative to a base value for a first component in a first region and a second, different number of bits to represent delta values relative to a base value for a second component in the first region.

In some embodiments, to determine the first and second numbers of bits, the compression circuitry determines a first initial number of bits to represent delta values in the first region for the first component based on a difference between corresponding smallest and greatest component values and a second initial number of bits to represent delta values in the first region for the second component based on a difference between corresponding smallest and greatest component values. The compression circuitry then selects the first and second numbers of bits in response to determining to reduce the first initial number of bits to share delta bits with the second component.

In some embodiments, the compression circuitry uses a mode-based look-up technique to determine whether to apply cross-component bit sharing. For example, the compression circuitry may determine a compression mode for the first component based on a difference between smallest and greatest component values in the first region for the first component. The compression circuitry may then determine whether to share bits based on modes of the different components. For example, each mode may indicate one or more of the following: an initial number of base bits, an initial number of delta bits, a compression level, a free level value that indicates a number of levels that can be given to another component without subtracting from the component's base or delta bits, and a protected base value that indicates whether the component's base bits can be decremented when giving one or more levels to another component. Based on these fields for each component in a region, cross-component bit sharing logic may determine the extent of bit sharing, e.g., to reduce overall quantization.

At 840, in the illustrated embodiment, the compression circuitry quantizes delta values for the first and second components of pixels in the first region of the block of pixels using the determined first and second numbers of bits. The deltas may be determined relative to a base pixel value. The quantization may result in lossy compression. In some embodiments, the compression circuitry quantizes deltas values for the first component of pixels in a second region of the block of pixels using a third, different determined number of bits. Said another way, the compression circuitry may quantize delta values for the same component using different numbers of bits in different regions.

In some embodiments, the compression circuitry is configured to select and apply direct quantization of pixel component values for a second region of the block of pixels. The compression circuitry may apply direct quantization (e.g., in contrast to base and delta values) in response to determining: that a level of quantization used for delta values for the second region creates quantization errors that exceed direct quantization of the input pixel data or that a floating point value of a component in the second region is included in a set of special floating point values.

At 850, in the illustrated embodiment, the compression circuitry stores a compressed version of the block of pixels using the quantized deltas. For example, the compression circuitry may write the compressed block of pixels to a level in a cache/memory hierarchy. The block may later be retrieved and decompressed for use in generating graphics frames.

As used herein, the term "each" is used to refer to every element in a set of multiple elements, but there may be other elements associated with the apparatus or method that are not being referred to. Said another way, where "each" is used with respect to an embodiment to attribute a property or action to every member of a plurality of elements, it is not intended to foreclose the possibility that the embodiment may include other instances of the element to which the property or action does not apply. For example, if an apparatus supports compression techniques A-F, the phrase "determine, for each technique in a set of multiple compression techniques, . . . " may refer to each technique in various subsets of all the supported techniques (e.g., subset A-B, B-E, D and F, etc.). Similarly, when performing an operation for "each component" of pixels in a block of pixels, this phrase may refer to some subset of all potential components, (e.g., when one or more of the components is not being used to store pixel information).

Example Device

Figure 9:
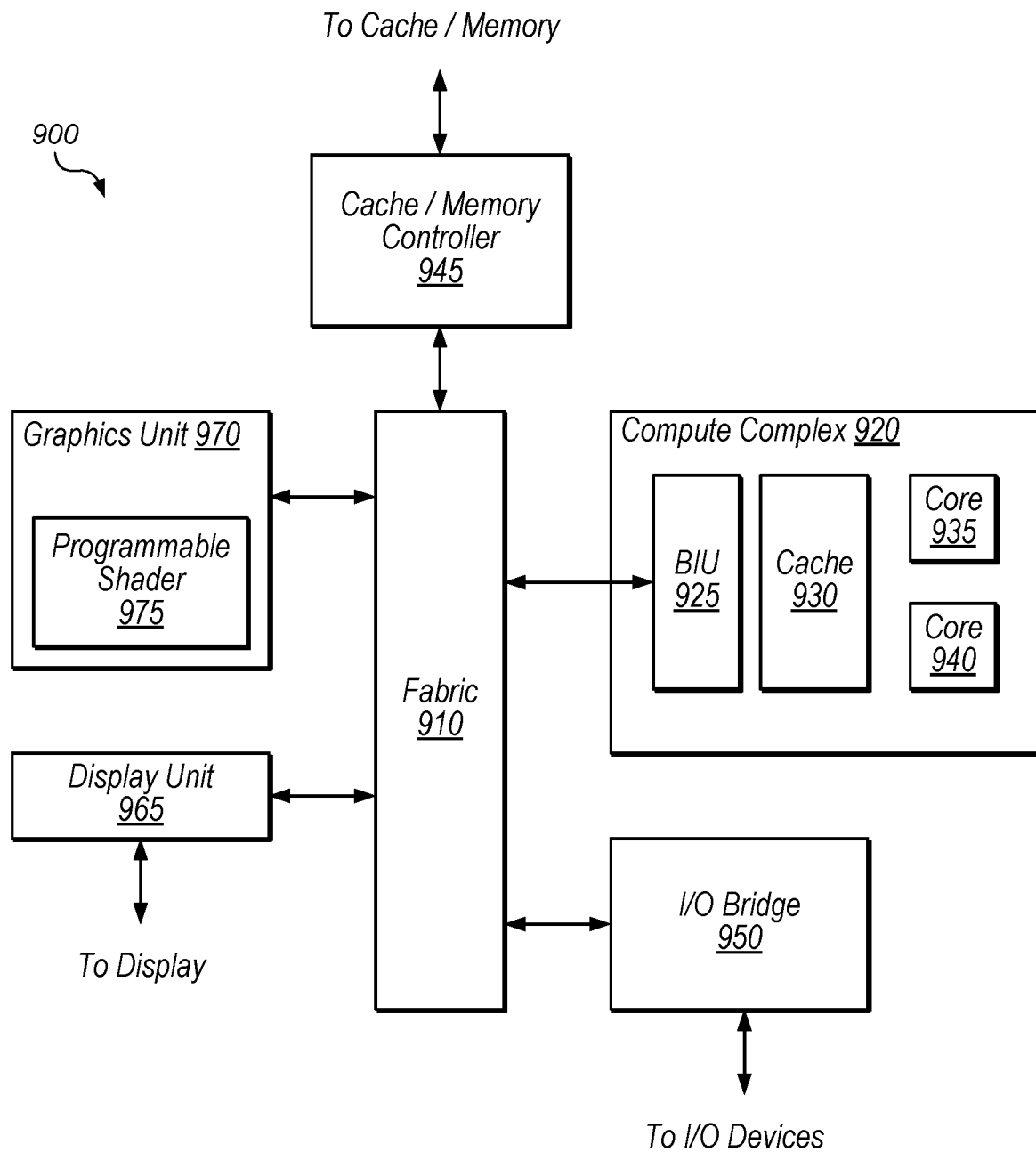
FIG. 9 is a block diagram illustrating an example computer system, according to some embodiments.
Figure 10:
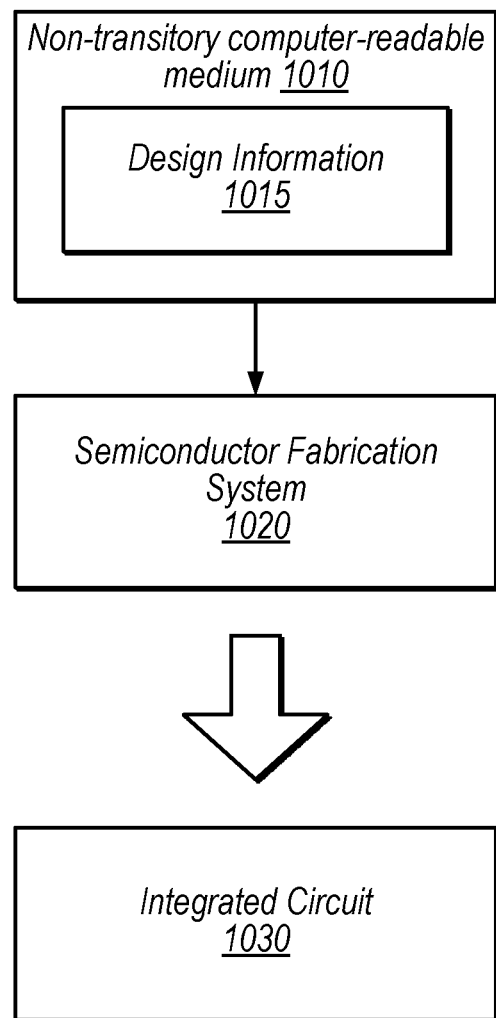
FIG. 10 a block diagram illustrating an example computer-readable medium that stores circuit design information, according to some embodiments.

Referring now to FIG. 9, a block diagram illustrating an example embodiment of a device 900 is shown. In some embodiments, elements of device 900 may be included within a system on a chip. In some embodiments, device 900 may be included in a mobile device, which may be battery-powered. Therefore, power consumption by device 900 may be an important design consideration. In the illustrated embodiment, device 900 includes fabric 910, compute complex 920 input/output (I/O) bridge 950, cache/memory controller 945, graphics unit 970, and display unit 965. In some embodiments, device 900 may include other components (not shown) in addition to and/or in place of the illustrated components, such as video processor encoders and decoders, image processing or recognition elements, computer vision elements, etc.

Fabric 910 may include various interconnects, buses, MUX's, controllers, etc., and may be configured to facilitate communication between various elements of device 900. In some embodiments, portions of fabric 910 may be configured to implement various different communication protocols. In other embodiments, fabric 910 may implement a single communication protocol and elements coupled to fabric 910 may convert from the single communication protocol to other communication protocols internally.

In the illustrated embodiment, compute complex 920 includes bus interface unit (BIU) 925, cache 930, and cores 935 and 940. In various embodiments, compute complex 920 may include various numbers of processors, processor cores and/or caches. For example, compute complex 920 may include 1, 2, or 4 processor cores, or any other suitable number. In one embodiment, cache 930 is a set associative L2 cache. In some embodiments, cores 935 and/or 940 may include internal instruction and/or data caches. In some embodiments, a coherency unit (not shown) in fabric 910, cache 930, or elsewhere in device 900 may be configured to maintain coherency between various caches of device 900. BIU 925 may be configured to manage communication between compute complex 920 and other elements of device 900. Processor cores such as cores 935 and 940 may be configured to execute instructions of a particular instruction set architecture (ISA) which may include operating system instructions and user application instructions.

Cache/memory controller 945 may be configured to manage transfer of data between fabric 910 and one or more caches and/or memories. For example, cache/memory controller 945 may be coupled to an L3 cache, which may in turn be coupled to a system memory. In other embodiments, cache/memory controller 945 may be directly coupled to a memory. In some embodiments, cache/memory controller 945 may include one or more internal caches.

As used herein, the term "coupled to" may indicate one or more connections between elements, and a coupling may include intervening elements. For example, in FIG. 9, graphics unit 970 may be described as "coupled to" a memory through fabric 910 and cache/memory controller 945. In contrast, in the illustrated embodiment of FIG. 9, graphics unit 970 is "directly coupled" to fabric 910 because there are no intervening elements.

Graphics unit 970 may include one or more processors and/or one or more graphics processing units (GPU's). Graphics unit 970 may receive graphics-oriented instructions, such as OPENGL®, Metal, or DIRECT3D® instructions, for example. Graphics unit 970 may execute specialized GPU instructions or perform other operations based on the received graphics-oriented instructions. Graphics unit 970 may generally be configured to process large blocks of data in parallel and may build images in a frame buffer for output to a display. Graphics unit 970 may include transform, lighting, triangle, and/or rendering engines in one or more graphics processing pipelines. Graphics unit 970 may output pixel information for display images. Programmable shader 975, in various embodiments, may include highly parallel execution cores configured to execute graphics programs, which may include pixel tasks, vertex tasks, and compute tasks (which may or may not be graphics-related).

In some embodiments, programmable shader 975 includes disclosed compression circuitry.

Display unit 965 may be configured to read data from a frame buffer and provide a stream of pixel values for display. Display unit 965 may be configured as a display pipeline in some embodiments. Additionally, display unit 965 may be configured to blend multiple frames to produce an output frame. Further, display unit 965 may include one or more interfaces (e.g., MIPI® or embedded display port (eDP)) for coupling to a user display (e.g., a touchscreen or an external display).

I/O bridge 950 may include various elements configured to implement: universal serial bus (USB) communications, security, audio, and/or low-power always-on functionality, for example. I/O bridge 950 may also include interfaces such as pulse-width modulation (PWM), general-purpose input/output (GPIO), serial peripheral interface (SPI), and/or inter-integrated circuit (I2C), for example. Various types of peripherals and devices may be coupled to device 900 via I/O bridge 950.

Example Computer-Readable Medium

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

FIG. 8 is a block diagram illustrating an example non-transitory computer-readable storage medium that stores circuit design information, according to some embodiments. In the illustrated embodiment semiconductor fabrication system 820 is configured to process the design information 815 stored on non-transitory computer-readable medium 810 and fabricate integrated circuit 830 based on the design information 815.

Non-transitory computer-readable storage medium 810, may comprise any of various appropriate types of memory devices or storage devices. Non-transitory computer-readable storage medium 810 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 810 may include other types of non-transitory memory as well or combinations thereof. Non-transitory computer-readable storage medium 810 may include two or more memory mediums which may reside in different locations, e.g., in different computer systems that are connected over a network.

Design information 815 may be specified using any of various appropriate computer languages, including hardware description languages such as, without limitation: VHDL, Verilog, SystemC, SystemVerilog, RHDL, M, MyHDL, etc. Design information 815 may be usable by semiconductor fabrication system 820 to fabricate at least a portion of integrated circuit 830. The format of design information 815 may be recognized by at least one semiconductor fabrication system 820. In some embodiments, design information 815 may also include one or more cell libraries which specify the synthesis and/or layout of integrated circuit 830. In some embodiments, the design information is specified in whole or in part in the form of a netlist that specifies cell library elements and their connectivity. Design information 815, taken alone, may or may not include sufficient information for fabrication of a corresponding integrated circuit. For example, design information 815 may specify the circuit elements to be fabricated but not their physical layout. In this case, design information 815 may need to be combined with layout information to actually fabricate the specified circuitry.

Integrated circuit 830 may, in various embodiments, include one or more custom macrocells, such as memories, analog or mixed-signal circuits, and the like. In such cases, design information 815 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 820 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 830 is configured to operate according to a circuit design specified by design information 815, which may include performing any of the functionality described herein. For example, integrated circuit 830 may include any of various elements shown in FIGS. 1A-1B. Further, integrated circuit 830 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
 compression circuitry configured to:
  access pixel data for a block of pixels being compressed;
  determine, for multiple different component data values included in pixel data for a given pixel of the block of pixels, respective smallest and greatest component values in respective different multi-pixel regions of the block of pixels;
  determine, based on the determined smallest and greatest component values, to use a first number of bits to represent delta values relative to a base value for a first component in a first region and a second, different number of bits to represent delta values relative to a base value for a second component in the first region;
  quantize delta values for the first and second components of pixels in the first region of the block of pixels using the determined first and second numbers of bits;
  store a compressed version of the block of pixels using the quantized deltas; and
  select and apply direct quantization of pixel component values for a second region of the block of pixels, in response to determining that a level of quantization to be used for delta values for the second region creates quantization errors that exceed direct quantization of the pixel data.

2. The apparatus of claim 1, wherein, to determine to use the first and second numbers of bits, the compression circuitry is configured to:
 determine a first initial number of bits to represent delta values in the first region for the first component;
 determine a second initial number of bits to represent delta values in the first region for the second component; and
 select the first and second numbers of bits in response to determining to reduce the first initial number of bits to share delta bits with the second component.

3. The apparatus of claim 2, wherein the compression circuitry is configured to:
 determine a compression mode for the first component based on a difference between smallest and greatest component values in the first region for the first component; and
 determine to reduce the first initial number of bits to share delta bits with the second component based on the determined compression mode, wherein the compression mode indicates an initial number of base bits, an initial number of delta bits, a free level value that indicates a number of levels that can be given to another component without subtracting from the component's base or delta bits, and a protected base value that indicates whether the component's base bits can be decremented when giving one or more levels to another component.

4. The apparatus of claim 1, wherein the compression circuitry is further configured to quantize deltas values for the first component of pixels in a second region of the block of pixels using a third, different determined number of bits.

5. The apparatus of claim 1, wherein the compression circuitry is configured to generate metadata for the compressed block of pixels that indicates: that the block of pixels was compressed using lossy compression, wherein the apparatus is configured to imply that the compressed block of pixels has a size that matches a target compression output size based on the use of lossy compression; and whether direct quantization of pixel component values was used for the respective ones of the regions.

6. The apparatus of claim 1, wherein the compression circuitry is further configured to, prior to determining the respective smallest and greatest values, apply a bias to one or more component values represented in a signed format.

7. The apparatus of claim 1, wherein the compression circuitry is further configured to determine to provide additional bits for representing quantized delta values, including to: quantize the base value; or increase quantization of the base value.

8. The apparatus of claim 7, wherein the compression circuitry is configured to apply direct quantization of pixel component values for a third region of the block of pixels in response to determining that a floating-point value of a component in the second region is included in a set of special floating-point values.

9. A method, comprising:
 accessing, by compression circuitry, pixel data for a block of pixels being compressed;

determining, by the compression circuitry, for multiple different component data values included in pixel data for a given pixel of the block of pixels, respective smallest and greatest component values in respective different multi-pixel regions of the block of pixels;

determining, by the compression circuitry based on the determined smallest and greatest component values, to use a first number of bits to represent delta values relative to a base value for a first component in a first region and a second, different number of bits to represent delta values relative to a base value for a second component in the first region;

quantizing, by the compression circuitry, delta values for the first and second components of pixels in the first region of the block of pixels using the determined first and second numbers of bits;

storing, by the compression circuitry, a compressed version of the block of pixels using the quantized deltas; and selecting and applying, by the compression circuitry, direct quantization of pixel component values for a second region of the block of pixels, in response to determining that a level of quantization to be used for delta values for the second region creates quantization errors that exceed direct quantization of the pixel data.

10. The method of claim 9, wherein the determining the first and second numbers of bits includes:

determining, by the compression circuitry, a first initial number of bits to represent delta values in the first region for the first component based on a difference between corresponding smallest and greatest component values;

determining, by the compression circuitry, a second initial number of bits to represent delta values in the first region for the second component based on a difference between corresponding smallest and greatest component values; and selecting, by the compression circuitry, the first and second numbers of bits in response to determining to reduce the first initial number of bits to share delta bits with the second component.

11. The method of claim 10, further comprising:

determining a compression mode for the first component based on a difference between smallest and greatest component values in the first region for the first component; and determining to reduce the first initial number of bits to share delta bits with the second component based on the determined compression mode, wherein the compression mode indicates an initial number of base bits, an initial number of delta bits, a compression level, and a free level value that indicates a number of levels that can be given to another component without subtracting from the component's base or delta bits.

12. The method of claim 9, further comprising:

determining, by the compression circuitry, provide additional bits for representing quantized delta values by:
quantizing the base value; or
increasing quantization of the base value.

13. The method of claim 9, further comprising:

generating metadata for the compressed block of pixels that indicates that the block of pixels was compressed using lossy compression, wherein decompression circuitry implies that the compressed block of pixels has a size that matches a target compression output size based on the use of lossy compression.

14. A non-transitory computer readable storage medium having stored thereon design information that specifies a design of at least a portion of a hardware integrated circuit in a format recognized by a semiconductor fabrication system that is configured to use the design information to produce the circuit according to the design, wherein the design information specifies that the circuit includes:

compression circuitry configured to:
access pixel data for a block of pixels being compressed;
determine, for multiple different component data values included in pixel data for a given pixel of the block of pixels, respective smallest and greatest component values in respective different multi-pixel regions of the block of pixels;
determine, based on the determined smallest and greatest component values, to use a first number of bits to represent delta values relative to a base value for a first component in a first region and a second, different number of bits to represent delta values relative to a base value for a second component in the first region;
quantize delta values for the first and second components of pixels in the first region of the block of pixels using the determined first and second numbers of bits;
store a compressed version of the block of pixels using the quantized deltas; and
select and apply direct quantization of pixel component values for a second region of the block of pixels, in response to determining that a level of quantization to be used for delta values for the second region creates quantization errors that exceed direct quantization of the pixel data.

15. The non-transitory computer readable storage medium of claim 14, wherein, to determine to use the first and second numbers of bits, the compression circuitry is configured to:

determine a first initial number of bits to represent delta values in the first region for the first component;

determine a second initial number of bits to represent delta values in the first region for the second component; and select the first and second numbers of bits in response to determining to reduce the first initial number of bits to share delta bits with the second component.

16. The non-transitory computer readable storage medium of claim 15, wherein the compression circuitry is configured to:

determine a compression mode for the first component based on a difference between smallest and greatest component values in the first region for the first component; and determine to reduce the first initial number of bits to share delta bits with the second component based on the determined compression mode, wherein the compression mode indicates an initial number of base bits, an initial number of delta bits, a compression level, and a free level value that indicates a number of levels that can be given to another component without subtracting from the component's base or delta bits.

17. The non-transitory computer readable storage medium of claim 14, wherein the compression circuitry is further configured to quantize deltas values for the first component of pixels in a second region of the block of pixels using a third, different determined number of bits.

18. The non-transitory computer readable storage medium of claim 14, wherein the compression circuitry is further configured to select and apply direct quantization of pixel component values for a third region of the block of pixels in response to determining that a floating-point value of a component in the second region is included in a set of special floating-point values.

19. The non-transitory computer readable storage medium of claim 14, wherein the compression circuitry is configured to generate metadata for the compressed block of pixels that indicates:

that the block of pixels was compressed using lossy compression, wherein the circuit is configured to imply that the compressed block of pixels has a size that matches a target compression output size based on the use of lossy compression; and whether direct quantization of pixel component values was used for the respective ones of the regions.

20. The non-transitory computer readable storage medium of claim 14, wherein the compression circuitry is further configured to, prior to determining the respective smallest and greatest values, apply a bias to one or more component values represented in a signed format.

\* \* \* \* \*